US009893270B2

(12) United States Patent
Araki et al.

(10) Patent No.: US 9,893,270 B2
(45) Date of Patent: Feb. 13, 2018

(54) METHOD FOR MANUFACTURING PIEZOELECTRIC BULK ACOUSTIC WAVE ELEMENT AND PIEZOELECTRIC BULK ACOUSTIC WAVE ELEMENT

(71) Applicant: MURATA MANUFACTURING CO., LTD., Nagaokakyo-shi, Kyoto-Fu (JP)

(72) Inventors: Kiyoto Araki, Nagaokakyo (JP); Keiichi Umeda, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 817 days.

(21) Appl. No.: 14/458,338

(22) Filed: Aug. 13, 2014

(65) Prior Publication Data

US 2014/0354110 A1    Dec. 4, 2014

Related U.S. Application Data

(63) Continuation of application No. PCT/JP2013/053042, filed on Feb. 8, 2013.

(30) Foreign Application Priority Data

Feb. 20, 2012 (JP) .................. 2012-034309

(51) Int. Cl.
*H01L 41/09* (2006.01)
*H03H 9/15* (2006.01)
(Continued)

(52) U.S. Cl.
CPC ............ *H01L 41/314* (2013.01); *H01L 41/04* (2013.01); *H03H 3/02* (2013.01);
(Continued)

(58) Field of Classification Search
CPC ......... H01L 41/314; H01L 41/04; H03H 3/02; H03H 9/02015; H03H 9/173
(Continued)

(56) References Cited

U.S. PATENT DOCUMENTS 6,384,697 B1    5/2002   Ruby
7,745,975 B2    6/2010   Asai et al.
(Continued)

FOREIGN PATENT DOCUMENTS

JP    2002-140075 A    5/2002
JP    2008-022305      1/2008
(Continued)

OTHER PUBLICATIONS

PCT/JP2013/053042 Written Opinion dated Mar. 26, 2013.

*Primary Examiner* — Thomas Dougherty
(74) *Attorney, Agent, or Firm* — Arent Fox LLP

(57) ABSTRACT

A method for manufacturing a piezoelectric bulk acoustic wave element by forming a sacrificial layer on a part of a primary surface of a substrate. A piezoelectric film sandwiched between a pair of electrodes is formed on the primary surface of the substrate so as to cover the sacrificial layer, the piezoelectric film being formed from scandium-containing aluminum nitride having a scandium atomic concentration with respect to the total number of scandium atoms and aluminum atoms of more than 24 atomic percent. An etching step of removing the sacrificial layer by etching is performed. Prior to the etching step, a protective film formed from aluminum nitride or scandium-containing aluminum nitride having a lower scandium atomic concentration than that of the piezoelectric film is provided so as to cover at least a part of a portion of the piezoelectric film located in a region in which the sacrificial layer is provided.

4 Claims, 6 Drawing Sheets

(51) Int. Cl.
  *H01L 41/314* (2013.01)
  *H03H 3/02* (2006.01)
  *H03H 9/02* (2006.01)
  *H03H 9/17* (2006.01)
  *H01L 41/04* (2006.01)

(52) U.S. Cl.
  CPC ........ *H03H 9/02015* (2013.01); *H03H 9/173* (2013.01); *H03H 2003/021* (2013.01)

(58) Field of Classification Search
  USPC ........................................ 310/311–371, 800
  See application file for complete search history.

(56) References Cited

U.S. PATENT DOCUMENTS

| | | | |
|---|---|---|---|
| 9,461,616 B2* | 10/2016 | Umeda | ............. H03H 9/02015 |
| 2008/0169728 A1 | 7/2008 | Asai et al. | |
| 2008/0296529 A1 | 12/2008 | Akiyama et al. | |
| 2012/0107557 A1 | 5/2012 | Akiyama et al. | |
| 2013/0176086 A1* | 7/2013 | Bradley | ............... H03H 9/1007 333/189 |
| 2014/0132117 A1* | 5/2014 | Larson, III | ............ C23C 14/025 310/357 |
| 2014/0246305 A1* | 9/2014 | Larson, III | ............ C23C 14/022 204/192.18 |
| 2016/0079513 A1* | 3/2016 | Thalmayr | ................ H03H 9/56 310/318 |

FOREIGN PATENT DOCUMENTS

| | | |
|---|---|---|
| JP | 2008-160322 A | 7/2008 |
| JP | 2008-172713 A | 7/2008 |
| JP | 2009-010926 A | 1/2009 |
| JP | 2011-015148 A | 1/2011 |

* cited by examiner

METHOD FOR MANUFACTURING PIEZOELECTRIC BULK ACOUSTIC WAVE ELEMENT AND PIEZOELECTRIC BULK ACOUSTIC WAVE ELEMENT

CROSS REFERENCE TO RELATED APPLICATIONS

The present application is a continuation of International application No. PCT/JP2013/053042, filed Feb. 8, 2013, which claims priority to Japanese Patent Application No. 2012-034309, filed Feb. 20, 2012, the entire contents of each of which are incorporated herein by reference.

FIELD OF THE INVENTION

The present invention relates to a method for manufacturing a piezoelectric bulk acoustic wave element and a piezoelectric bulk acoustic wave element.

BACKGROUND OF THE INVENTION

Heretofore, for example, in Patent Document 1 and the like, various piezoelectric bulk acoustic wave elements each using a piezoelectric thin film have been proposed. In Patent Document 1, as a method for manufacturing a piezoelectric bulk acoustic wave element, the following method has been disclosed. First, a sacrificial layer is provided in a recess portion of a substrate. Subsequently, a piezoelectric thin film sandwiched between a pair of electrodes is formed so as to cover the sacrificial layer. Next, the sacrificial layer is removed by etching. It has been disclosed that a hydrofluoric acid is used to etch the sacrificial layer.

In addition, Patent Document 2 has disclosed a piezoelectric thin film formed of an aluminum nitride thin film containing scandium. It has been disclosed that the piezoelectric thin film formed of an aluminum nitride thin film containing scandium has a preferable piezoelectric response performance.

Patent Document 1: Japanese Unexamined Patent Application Publication No. 2002-140075
Patent Document 2: Japanese Unexamined Patent Application Publication No. 2011-15148

SUMMARY OF THE INVENTION

The present inventors found that when a piezoelectric bulk acoustic wave element using an aluminum nitride thin film containing scandium as a piezoelectric thin film is manufactured by a method using the sacrificial layer disclosed in Patent Document 1, the characteristics of the piezoelectric bulk acoustic wave element are degraded.

A primary object of the present invention is to provide a method which is able to manufacture a piezoelectric bulk acoustic wave element having excellent characteristics.

In a method for manufacturing a piezoelectric bulk acoustic wave element of the present invention, a sacrificial layer is formed on a part of a primary surface of a substrate. A piezoelectric film sandwiched between a pair of electrodes is formed on the primary surface of the substrate so as to cover the sacrificial layer, the piezoelectric film being formed from scandium-containing aluminum nitride having a scandium atomic concentration with respect to the total number of scandium atoms and aluminum atoms (number of scandium atoms/(number of scandium atoms+number of aluminum atoms)) being more than 24 atomic percent. An etching step of removing the sacrificial layer by etching is performed. Prior to the etching step, a protective film formed from aluminum nitride or scandium-containing aluminum nitride having a scandium atomic concentration lower than that of the piezoelectric film is provided so as to cover at least a part of a portion of the piezoelectric film located in a region in which the sacrificial layer is provided.

In a specific aspect of the method for manufacturing a piezoelectric bulk acoustic wave element of the present invention, a through hole facing the sacrificial layer is formed in the piezoelectric film, and the protective film is provided so as to cover at least a part of the surface of the through hole.

In another specific aspect of the method for manufacturing a piezoelectric bulk acoustic wave element of the present invention, the through hole is formed so that the diameter thereof is decreased toward the sacrificial layer.

In another specific aspect of the method for manufacturing a piezoelectric bulk acoustic wave element of the present invention, the protective film is formed from scandium-containing aluminum nitride having a scandium atomic concentration of 24 atomic percent or less.

In still another specific aspect of the method for manufacturing a piezoelectric bulk acoustic wave element of the present invention, etching of the sacrificial layer is performed using an etching solution containing hydrogen fluoride.

In still another specific aspect of the method for manufacturing a piezoelectric bulk acoustic wave element of the present invention, before the piezoelectric film is formed, a part of the protective film is formed on the sacrificial layer, and after the piezoelectric film is formed, the remaining part of the protective film is further formed on the piezoelectric film.

A piezoelectric bulk acoustic wave element of the present invention comprises a substrate, a piezoelectric film, a pair of electrodes, and a protective film. The piezoelectric film is provided on the substrate so that at least a part of the piezoelectric film is apart from the substrate. The piezoelectric film is formed from scandium-containing aluminum nitride having a scandium atomic concentration with respect to the total number of scandium atoms and aluminum atoms (number of scandium atoms/(number of scandium atoms+ number of aluminum atoms)) of more than 24 atomic percent. The pair of electrodes sandwiches the piezoelectric film. The protective film is provided so as to cover at least a part of the surface of the portion of the piezoelectric film which is apart from the substrate. The protective film is formed from aluminum nitride or scandium-containing aluminum nitride having a scandium atomic concentration lower than that of the piezoelectric film.

According to the present invention, a method for manufacturing a piezoelectric bulk acoustic wave element having excellent characteristics can be provided.

DETAILED DESCRIPTION OF THE PREFERRED EMBODIMENTS

Figure 1:
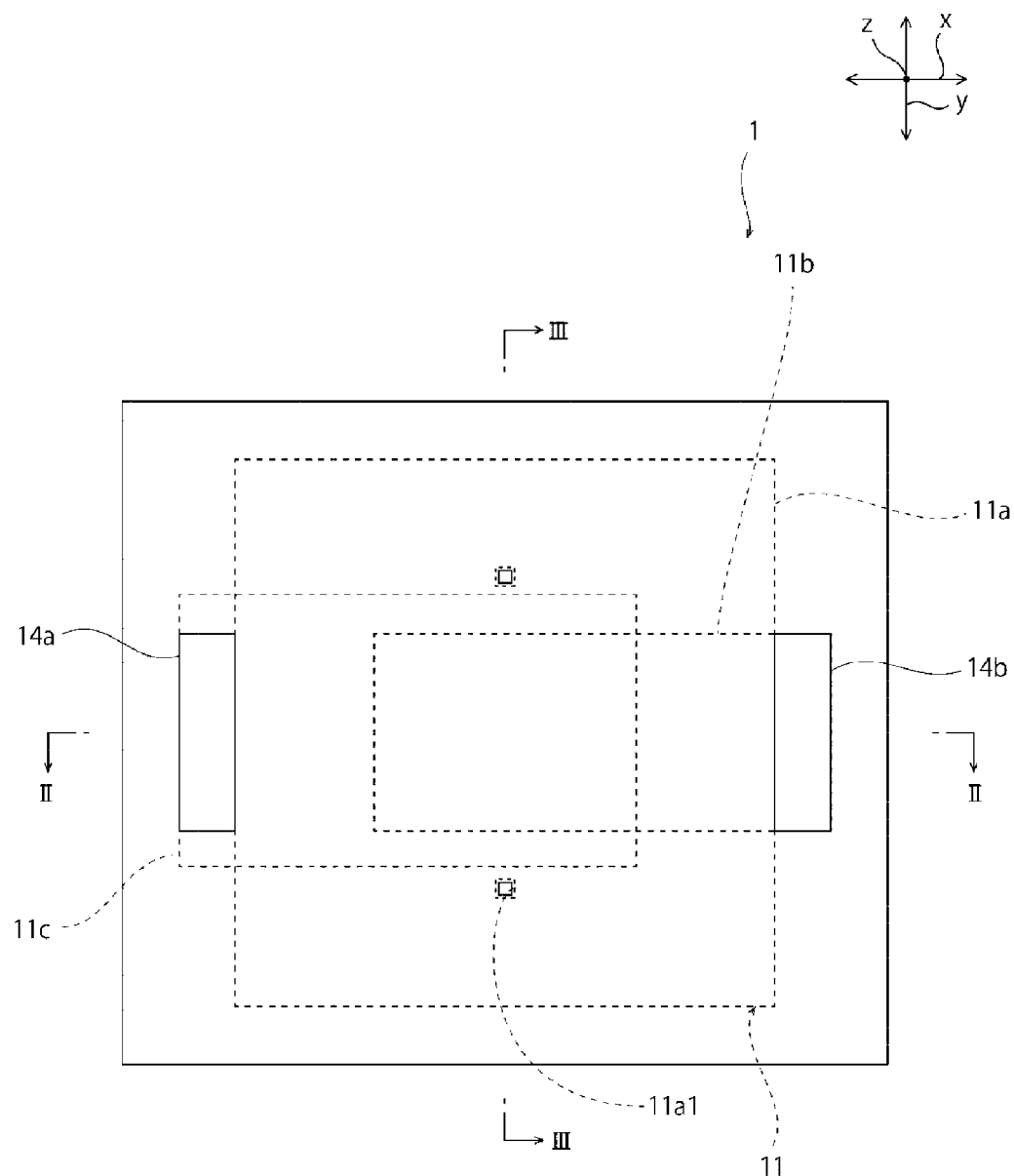
FIG. 1 is a schematic plan view of a piezoelectric bulk acoustic wave element according to an embodiment of the present invention.

Hereinafter, one example of preferable embodiments of the present invention will be described. However, the following embodiments are merely shown by way of example. The present invention is not limited to the following embodiments at all.

In addition, in the individual drawings shown in the embodiments and the like, members having substantially the same function are to be designated by the same reference sign. In addition, the drawings shown in the embodiments and the like are each schematically drawn, and for example, the ratio in dimension of an object shown in the drawing may be different from the ratio in dimension of an actual object in some cases. In addition, between the drawings, for example, the ratio in dimension of an object may be different from each other in some cases. The ratio in dimension and the like of a concrete object is to be understood in consideration of the following description.

Structure of Piezoelectric Bulk Acoustic Wave Element 1

Figure 2:
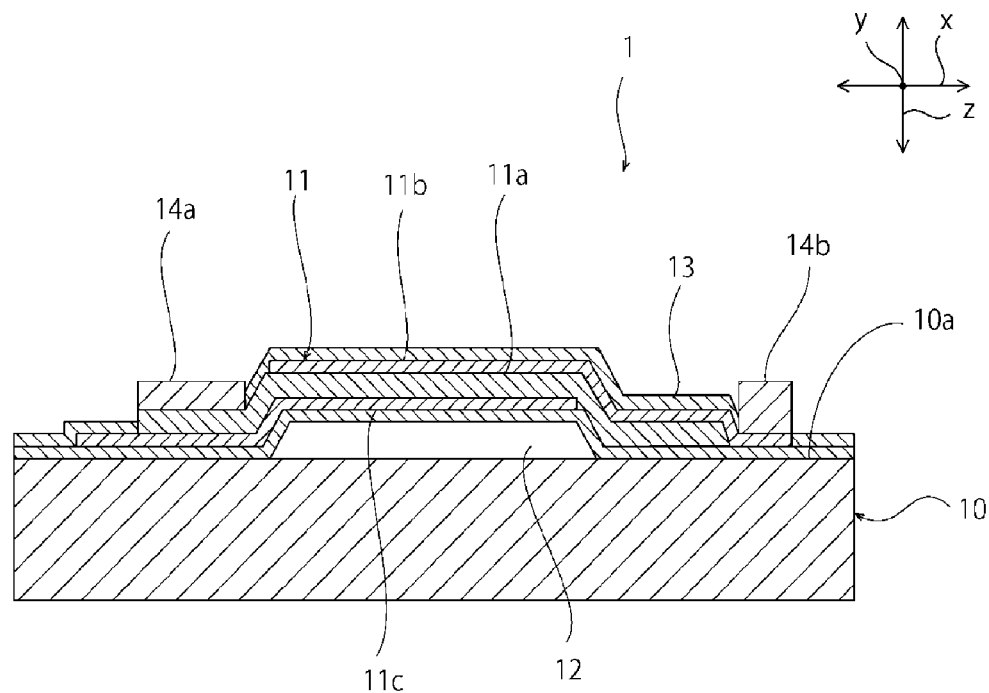
FIG. 2 is a schematic cross-sectional view along the line II-II in FIG. 1.
Figure 3:
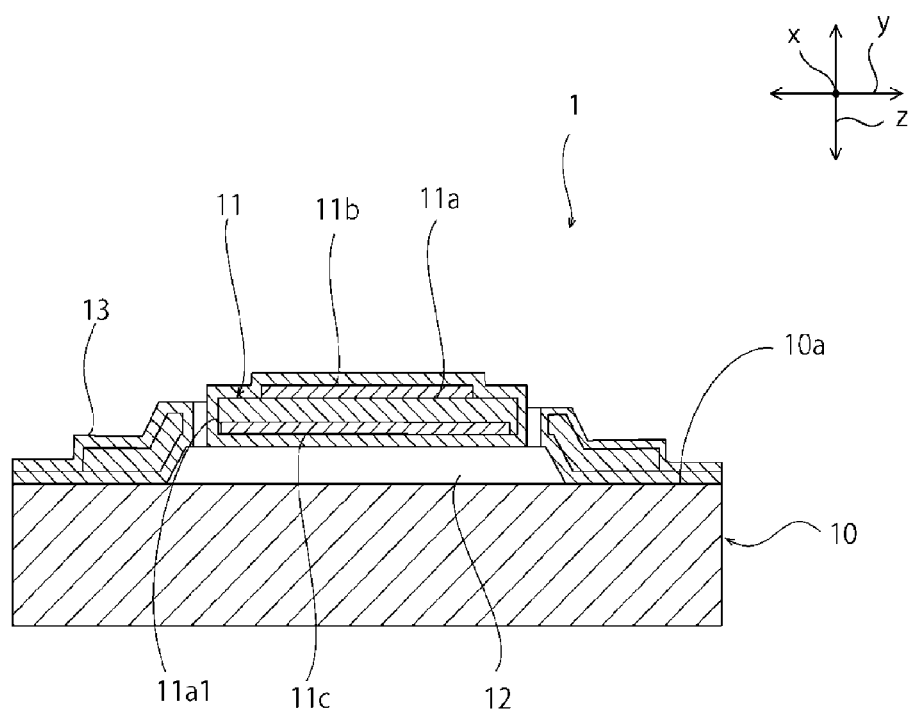
FIG. 3 is a schematic cross-sectional view along the line III-III in FIG. 1.

FIG. 1 is a schematic plan view of a bulk acoustic wave element according to this embodiment. FIG. 2 is a schematic cross-sectional view along the line II-II in FIG. 1. FIG. 3 is a schematic cross-sectional view along the line III-III in FIG. 1.

As shown in FIGS. 1 to 3, a piezoelectric bulk acoustic wave element 1 includes a substrate 10. The substrate 10 may be formed, for example, from silicon. In addition, the substrate 10 may be formed of a silicon substrate and an insulating layer which is provided on the silicon substrate and which is formed, for example, from silicon oxide.

A piezoelectric element 11 is provided on a primary surface 10a of the substrate 10. The piezoelectric element 11 includes a piezoelectric film 11a and a pair of electrodes 11b and 11c which sandwich the piezoelectric film 11a.

The piezoelectric film 11a is formed from scandium-containing aluminum nitride having a scandium atomic concentration with respect to the total number of scandium atoms and aluminum atoms (number of scandium atoms/(number of scandium atoms+number of aluminum atoms)) of more than 24 atomic percent.

The electrodes 11b and 11c each may be formed, for example, from at least one metal selected from the group consisting of Pt, Au, Ti, Mo, W, Cr, Al, and Ru.

At least a part of the piezoelectric element 11 is provided so as to be apart from the substrate 10. In particular, a peripheral portion of the piezoelectric element 11 is provided so as to be in contact with the substrate 10, and a central portion of the piezoelectric element 11 is provided so as to be apart from the substrate 10. Hence, an internal space 12 is formed between the piezoelectric element 11 and the substrate 10.

At least a part of the central portion of the piezoelectric element 11 which is apart from the substrate 10, the electrodes 11b and 11c face each other in a thickness direction thereof with the piezoelectric film 11a provided therebetween. A portion of the piezoelectric element 11 at which the electrodes 11b and 11c face each other forms a vibration portion.

Through holes 11a1 are provided to penetrate the piezoelectric film 11a in a thickness direction thereof and to face the internal space 12. The through holes 11a1 are each provided in a region other than that at which the electrodes 11b and 11c face each other.

Although the through hole 11a1 may be formed of a through hole having an approximately constant diameter, the through hole 11a1 is preferably formed of a tapered through hole in which the diameter thereof is decreased toward a substrate 10 side.

The surface of the piezoelectric element 11 is covered with a protective film 13. The protective film 13 covers at least a part of the surface of the portion of the piezoelectric film 11a which is apart from the substrate 10. In particular, the protective film 13 covers substantially the entire piezoelectric film 11a. In more particular, the protective film 13 substantially covers the entire surface of the piezoelectric film 11a at the substrate 10 side, the entire surface of the piezoelectric film 11a at the side opposite to the substrate 10 other than portions at which pad electrodes 14a and 14b are provided, and the entire surfaces of the through holes 11a1.

The protective film 13 is formed from aluminum nitride or scandium-containing aluminum nitride having a scandium atomic concentration lower than that of the piezoelectric film. The protective film 13 is preferably formed from scandium-containing aluminum nitride having a scandium atomic concentration of 24 atomic percent or less, is more preferably formed from scandium-containing aluminum nitride having a scandium atomic concentration of 16 atomic percent or less, and is even more preferably formed from aluminum nitride substantially containing no scandium.

Method for Manufacturing Piezoelectric Bulk Acoustic Wave Element 1

Next, one example of a method for manufacturing the piezoelectric bulk acoustic wave element 1 will be described primarily with reference to FIGS. 4 to 10.

Figure 4:
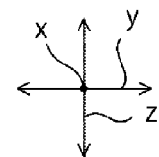
FIG. 4 is a schematic cross-sectional view illustrating a method for manufacturing the piezoelectric bulk acoustic wave element according to the embodiment of the present invention.
Figure 4:
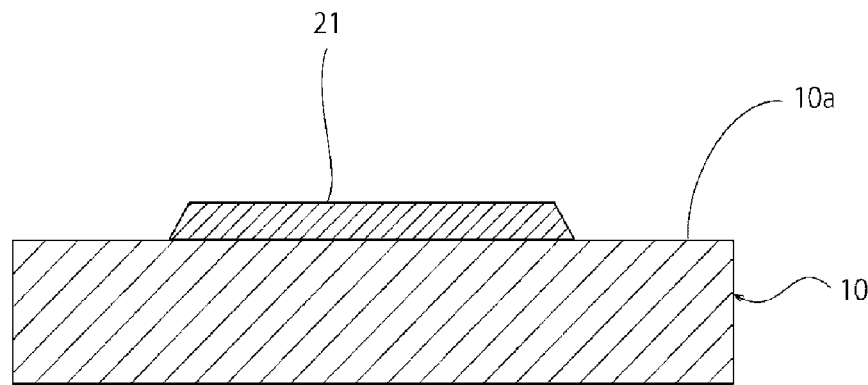

First, as shown in FIG. 4, a sacrificial layer 21 is formed on a part of the primary surface 10a of the substrate 10. In particular, the sacrificial layer 21 is formed in a region in which the internal space 12 is preferably formed.

The sacrificial layer 21 may be formed, for example, from silicon oxide, silicon nitride, PSG (phosphorus silicate glass), or titanium. The sacrificial layer 21 may be formed, for example, by a sputtering method or a CVD (Chemical Vapor Deposition) method.

Figure 5:
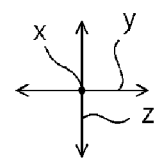
FIG. 5 is a schematic cross-sectional view illustrating the method for manufacturing the piezoelectric bulk acoustic wave element according to the embodiment of the present invention.
Figure 5:
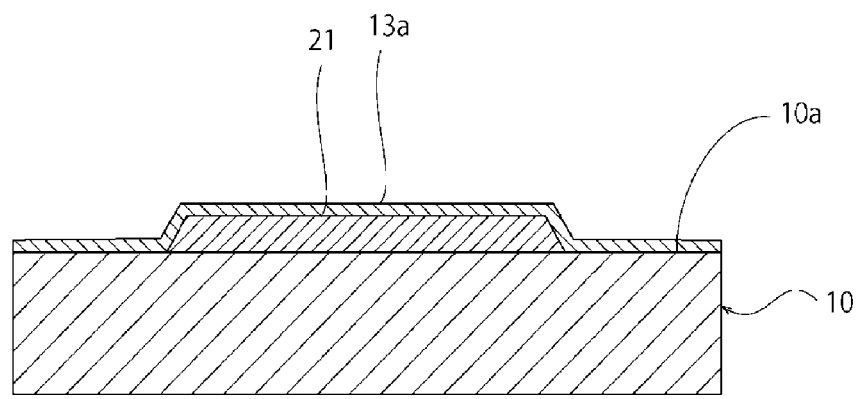

Next, as shown in FIG. 5, a protective film 13a is formed so as to cover substantially the entire primary surface 10a of the substrate 10 including the surface of the sacrificial layer 21. This protective film 13a functions to form a part of the protective film 13. The protective film 13a may be formed, for example, by a sputtering method or a CVD method.

Figure 6:
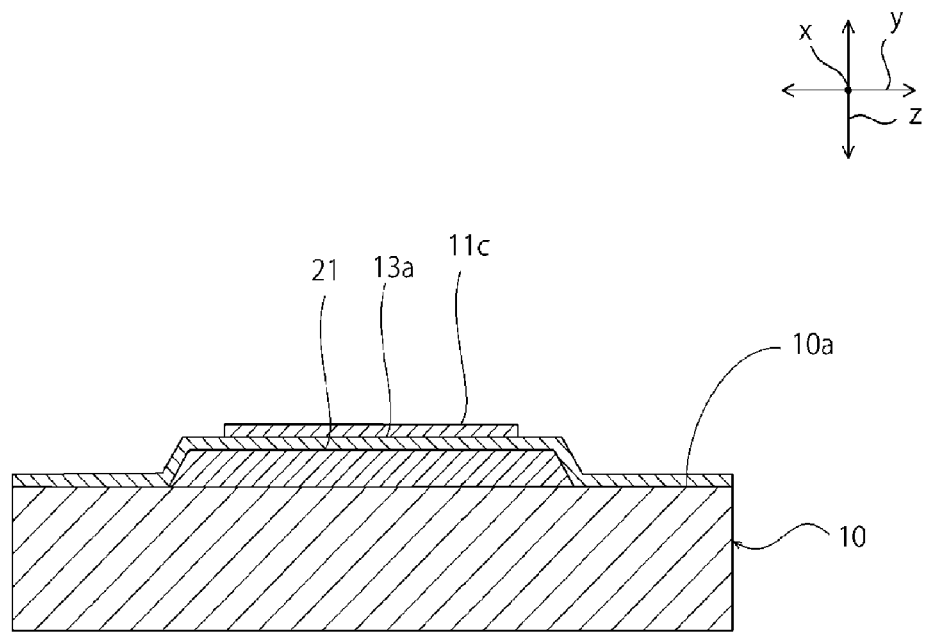
FIG. 6 is a schematic cross-sectional view illustrating the method for manufacturing the piezoelectric bulk acoustic wave element according to the embodiment of the present invention.

Next, as shown in FIG. 6, the electrode 11c is formed. The electrode 11c may be formed, for example, by a sputtering method or a CVD method.

Figure 7:
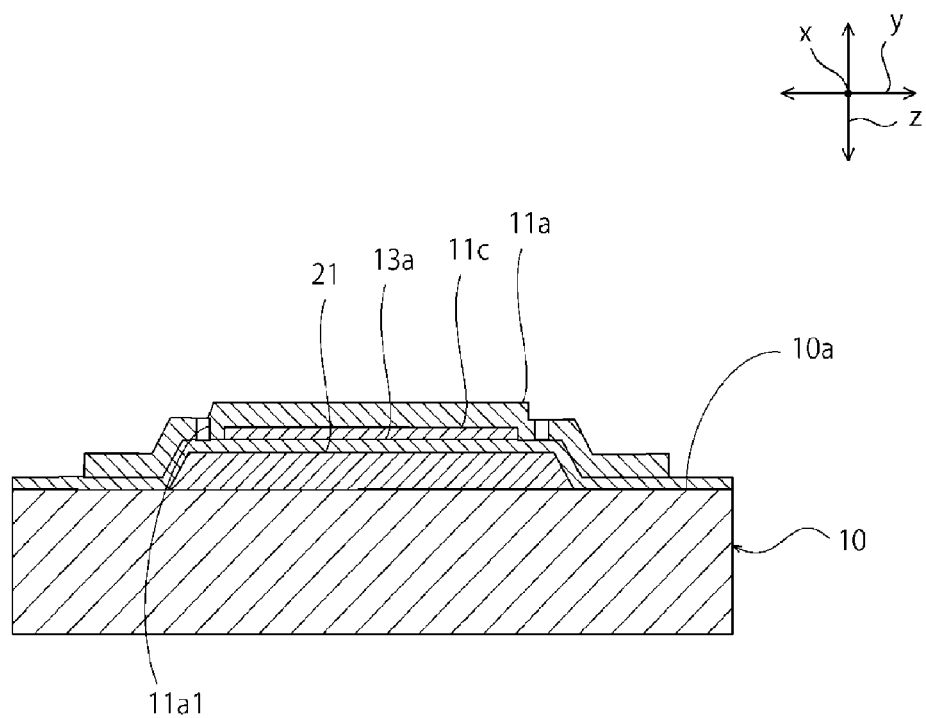
FIG. 7 is a schematic cross-sectional view illustrating the method for manufacturing the piezoelectric bulk acoustic wave element according to the embodiment of the present invention.

Next, as shown in FIG. 7, the piezoelectric film 11a is formed so as to cover the sacrificial layer 21. The piezoelectric film 11a may be formed, for example, by a sputtering method or a CVD method. In the piezoelectric film 11a, the through holes 11a1 are formed. Those through holes 11a1 each may be formed, for example, by etching. When the through hole 11a1 is formed by etching, the through hole 11a1 is formed to have a tapered shape so that the diameter thereof is decreased toward a sacrificial layer 21 side.

Figure 8:
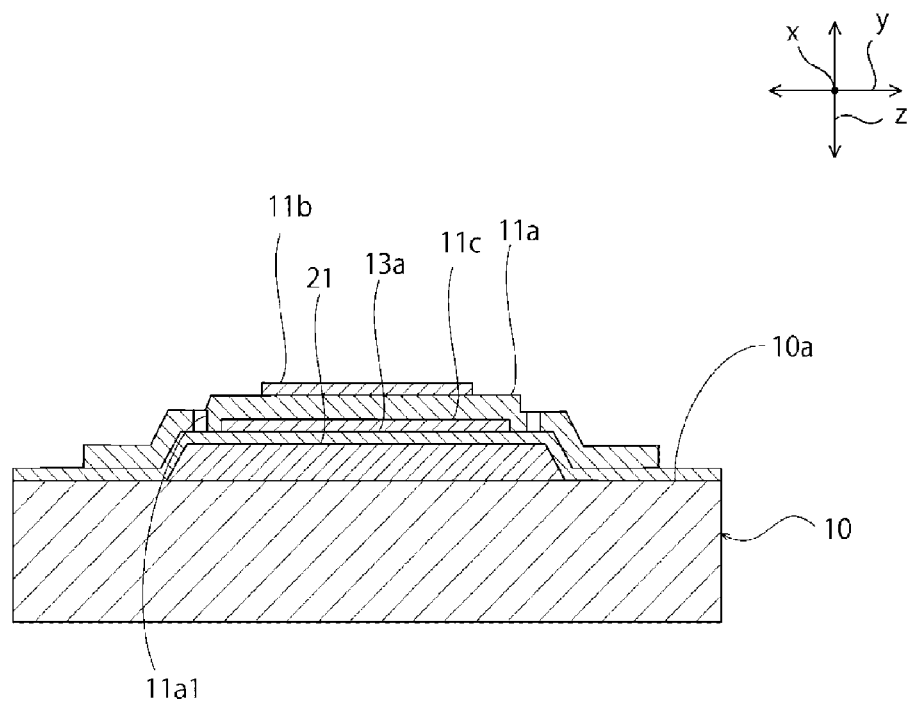
FIG. 8 is a schematic cross-sectional view illustrating the method for manufacturing the piezoelectric bulk acoustic wave element according to the embodiment of the present invention.

Next, as shown in FIG. 8, the electrode 11b is formed. The electrode 11b may be formed, for example, by a sputtering method or a CVD method.

Figure 9:
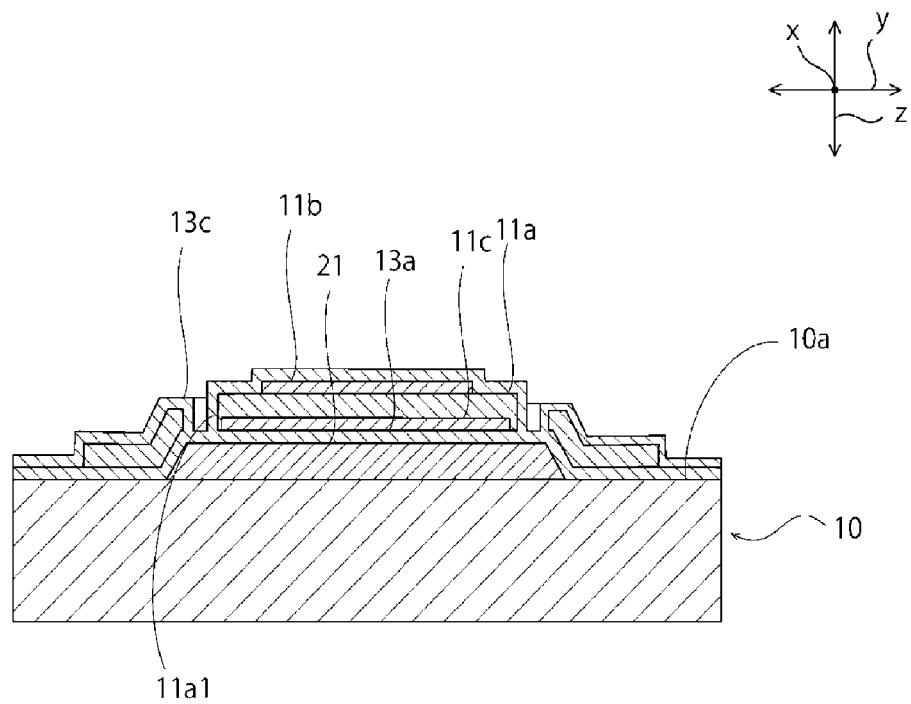
FIG. 9 is a schematic cross-sectional view illustrating the method for manufacturing the piezoelectric bulk acoustic wave element according to the embodiment of the present invention.

Next, as shown in FIG. 9, a protective film 13c is formed on at least a part of the piezoelectric film 11a. This protective film 13c functions to form a part of the protective film 13. The protective film 13c is provided so as to cover substantially the entire piezoelectric film 11a including the surface of the electrode 11b. In more particular, the protective film 13c is provided so as to cover substantially the entire primary surface 10a.

Figure 10:
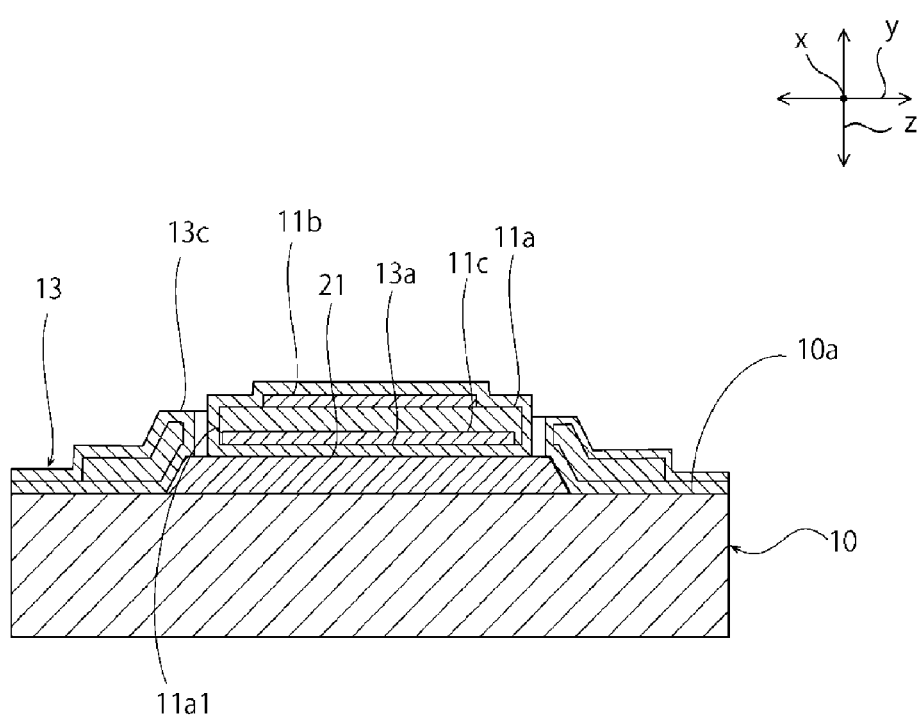
FIG. 10 is a schematic cross-sectional view illustrating the method for manufacturing the piezoelectric bulk acoustic wave element according to the embodiment of the present invention.

Next, as shown in FIG. 10, the protective film 13c is partially removed by etching. In particular, parts of the protective film 13c are removed which are provided on the sacrificial layer 21 in the through holes 11a1 and which are provided on portions at which the pad electrodes 14a and 14b are to be provided. Accordingly, the sacrificial layer 21 is exposed. In addition, the surfaces of the through holes 11a1 are each still covered with the protective film 13c.

Next, the pad electrodes 14a and 14b are formed.

Next, when the sacrificial layer 21 is removed by etching, the piezoelectric bulk acoustic wave element 1 shown in FIG. 1 can be formed. In this case, an etching solution is supplied to the sacrificial layer 21 through at least one of the through holes 11a1. For etching of the sacrificial layer 21, an etching solution containing hydrogen fluoride is preferably used. As a particular example of the etching solution containing hydrogen fluoride, for example, a hydrofluoric acid, a fluonitric acid, a mixture of hydrofluoric acid and sulfuric acid, or a buffered hydrofluoric acid may be mentioned.

Incidentally, in the bulk acoustic wave element 1, the piezoelectric film 11a is formed from scandium-containing aluminum nitride having a scandium atomic concentration with respect to the total number of scandium atoms and aluminum atoms (number of scandium atoms/(number of scandium atoms+number of aluminum atoms)) of more than 24 atomic percent. The scandium-containing aluminum nitride having a scandium atomic concentration of more than 24 atomic percent is easily dissolved in an etching solution containing a hydrofluoric acid. Hence, in the step of removing the sacrificial layer by etching, the piezoelectric film may be partially dissolved in some cases. As a result, the thickness of the vibration portion of the piezoelectric film is changed, and the characteristics of the bulk acoustic wave element may be degraded in some cases.

Hence, in the piezoelectric bulk acoustic wave element 1, while at least a part of the portion of the piezoelectric film 11a located in a region in which the sacrificial layer 21 is provided is covered with the protective film 13, that is, while at least a part of the vibration portion of the piezoelectric film 11a is covered with the protective film 13, the sacrificial layer 21 is removed by etching. The protective film 13 is formed from aluminum nitride or scandium-containing aluminum nitride having a scandium atomic concentration lower than that of the piezoelectric film 11a, each of which has a low solubility to an etching solution containing hydrogen fluoride as compared to that of scandium-containing aluminum nitride having a scandium atom concentration of more than 24 atomic percent. Hence, the dissolution of the vibration portion of the piezoelectric film 11a can be suppressed. As a result, a piezoelectric bulk acoustic wave element 1 having excellent characteristics can be manufactured.

In particular, the part of the piezoelectric film 11a in which the through hole 11a1 is provided is liable to be corroded by an etching solution. Hence, the surface of the through hole 11a1 is preferably covered with the protective film 13. When the through hole 11a1 has a tapered shape in which the diameter thereof is decreased toward the sacrificial layer 21 side, it is more preferable since the protective film 13 is easily formed on the surface of the through hole 11a1.

In addition, through intensive research carried out by the present inventors, it was first discovered that the solubility of scandium-containing aluminum nitride to an etching solution containing hydrogen fluoride depends on the scandium atomic concentration, and that the solubility of scandium-containing aluminum nitride to an etching solution containing hydrogen fluoride is decreased as the scandium atomic concentration is decreased.

In order to effectively suppress the corrosion of the piezoelectric film 11a caused by an etching solution, the protective film 13 is preferably formed from scandium-containing aluminum nitride having a scandium atomic concentration of 24 atomic percent of less, more preferably formed from scandium-containing aluminum nitride having a scandium atomic concentration of 16 atomic percent or less, and even more preferably formed from nitride aluminum containing substantially no scandium.

Alternatively, after a recess portion is formed in the primary surface 10a of the substrate 10, the sacrificial layer 21 may be provided in the recess portion.

In order to increase the strength of the portion of the piezoelectric element 11 which is apart from the substrate 10, a reinforcing film may be provided on the protective film 13. The reinforcing film may be formed, for example, from an insulating film of silicon oxide, silicon nitride, or the like.

REFERENCE SIGNS LIST 1 piezoelectric bulk acoustic wave element
10 substrate
10a primary surface
11 piezoelectric element
11a piezoelectric film
11a1 through hole
11b, 11c electrode
12 internal space
13, 13a, 13c protective film
14a, 14b pad electrode
21 sacrificial layer

The invention claimed is:

1. A piezoelectric bulk acoustic wave element comprising:
a substrate;
a piezoelectric film on the substrate and configured so that at least a part of the piezoelectric film is spaced apart from the substrate to form an internal space between the piezoelectric film and the substrate, the piezoelectric film being a scandium-containing aluminum nitride having a scandium atomic concentration with respect to a total number of scandium atoms and aluminum atoms of more than 24 atomic percent, the piezoelectric film having a through hole extending to the internal space;
a pair of electrodes which sandwich the piezoelectric film; and
a protective film covering at least a part of a surface of the portion of the piezoelectric film which is spaced apart from the substrate and at least a part of a surface of the through hole, the protective film being a scandium-containing aluminum nitride having a lower scandium atomic concentration than that of the piezoelectric film.

2. The piezoelectric bulk acoustic wave element according to claim 1, wherein a diameter of the through hole is smaller proximal to the sacrificial layer.

3. The piezoelectric bulk acoustic wave element according to claim 1, wherein the scandium atomic concentration of the protective film is 16 atomic percent or less.

4. The piezoelectric bulk acoustic wave element according to claim 1, wherein the protective film covers the entire surface of the through hole.

* * * * *